United States Patent
Chen et al.

(10) Patent No.: US 7,457,135 B2
(45) Date of Patent: Nov. 25, 2008

(54) ASSEMBLY FOR SECURING PLATES

(75) Inventors: Yun-Lung Chen, Tu-Cheng (TW);
Yi-Chung Hsiao, Tu-Cheng (TW);
Ming-Xian Sun, Shenzhen (CN)

(73) Assignees: Hong Fu Precision Industry (Shenzhen) Co., Ltd., Bo-an District, Shenzhen, Gunagdong Province (CN); Hon-Hai Precision Industry Co., Ltd., Tu-Cheng, Tapei Hsien (TW)

( * ) Notice: Subject to any disclaimer, the term of this patent is extended or adjusted under 35 U.S.C. 154(b) by 269 days.

(21) Appl. No.: 11/314,600

(22) Filed: Dec. 20, 2005

(65) Prior Publication Data

US 2007/0076402 A1  Apr. 5, 2007

(30) Foreign Application Priority Data

Aug. 19, 2005 (CN) .................... 2005 2 0063525 U

(51) Int. Cl.
*H05K 9/00* (2006.01)
(52) U.S. Cl. .................... 361/816; 361/800; 361/818
(58) Field of Classification Search ................ 361/818, 361/816, 801–802; 174/51, 35 R
See application file for complete search history.

(56) References Cited

U.S. PATENT DOCUMENTS

| | | | |
|---|---|---|---|
| 4,759,466 A * | 7/1988 | Chase et al. | 220/4.02 |
| 4,912,961 A | 4/1990 | Brown | |
| 5,191,544 A * | 3/1993 | Benck et al. | 361/688 |
| 5,353,201 A * | 10/1994 | Maeda | 361/816 |
| 5,726,867 A * | 3/1998 | Zarreii | 361/818 |
| 6,060,659 A * | 5/2000 | Borowiec et al. | 174/372 |
| 6,375,283 B1 * | 4/2002 | Kitamura et al. | 312/7.1 |
| 6,724,637 B2 * | 4/2004 | Li et al. | 361/760 |
| 6,809,932 B2 * | 10/2004 | Wu | 361/719 |
| 6,908,338 B2 * | 6/2005 | Okamoto | 439/607 |
| 7,095,624 B2 * | 8/2006 | Daoud et al. | 361/800 |

* cited by examiner

*Primary Examiner*—Tuan T. Dinh
*Assistant Examiner*—Hung S Bui
(74) *Attorney, Agent, or Firm*—Morris Manning Martin LLP; Tim Tingkang Xia, Esq.

(57) ABSTRACT

An assembly for securing plates includes a first plate having two pairs of protruding portions, and a second plate having two tongue pieces at opposite ends thereof. Each of the protruding portions has a first guiding surface and a second guiding surface intersecting with the first guiding surface for the tongue piece sliding thereon. The tongue pieces firstly slide downwardly along the first guiding surfaces of the pair of protruding portions and are then clamped between the corresponding protruding portions, thereby detachably securing the second plate to the first plate.

16 Claims, 3 Drawing Sheets

ASSEMBLY FOR SECURING PLATES

BACKGROUND OF THE INVENTION

1. Field of the Invention

The present invention relates to an assembly for securing plates, and more particularly to an assembly for securing plates with a simplified configuration for convenient removal or attachment.

2. General Background

Generally, there are four conventional methods for securing plates. The first method is to connect a plurality of plates together with screws or bolts. The second method is to connect a plurality of plates together with rivets. The third method is to connect a plurality of plates together by welding. The fourth method is to connect a plurality of plates together with glue.

An example of a typical assembly for securing plates, referring to FIG. 3, includes an upper plate 12 and a lower plate 14. A screw hole is defined in the upper and lower plates 12, 14. A screw extends through the screw holes of the upper and lower plate 12, 14, thereby firmly securing the upper plate 12 to the lower plate 14. However, the screw is usually very small, therefore making it difficult for an operator to hold the screw in position while using a screwdriver. Thus, assembly and disassembly is laborious, time-consuming, and costly. In addition, plates connected by rivets or by welding are not convenient to disassemble. Furthermore, plates connected with glue may be unreliable and prone to coming apart due to improper bonding. Therefore, an improved assembly for securing plates, which overcomes the above-mentioned problems, is desired.

What is needed, therefore, is an assembly for securing plates with a simplified configuration for convenient removal or attachment.

SUMMARY

An assembly for securing plates includes a first plate having two pairs of protruding portions, and a second plate having two tongue pieces at opposite ends thereof. Each of the protruding portions has a first guiding surface and a second guiding surface intersecting with the first guiding surface for the tongue piece sliding thereon. The tongue pieces firstly slide downwardly along the first guiding surfaces of the pair of protruding portions and are then clamped between the corresponding protruding portions, thereby detachably securing the second plate to the first plate.

Other advantages and novel features will be drawn from the following detailed description of preferred embodiments with the attached drawings, in which:

DETAILED DESCRIPTION OF THE EMBODIMENT

An assembly for securing plates of an electronic device like a computer in accordance with a preferred embodiment generally applies to connection of general metal plates and especially applies to connection of plates in computer enclosures, servers, and other similar devices. Furthermore, the plates are made of metallic material (for example, Fe, Al, or an alloy thereof) or non-metallic material (for example, plastic, or glass material).

Figure 1:
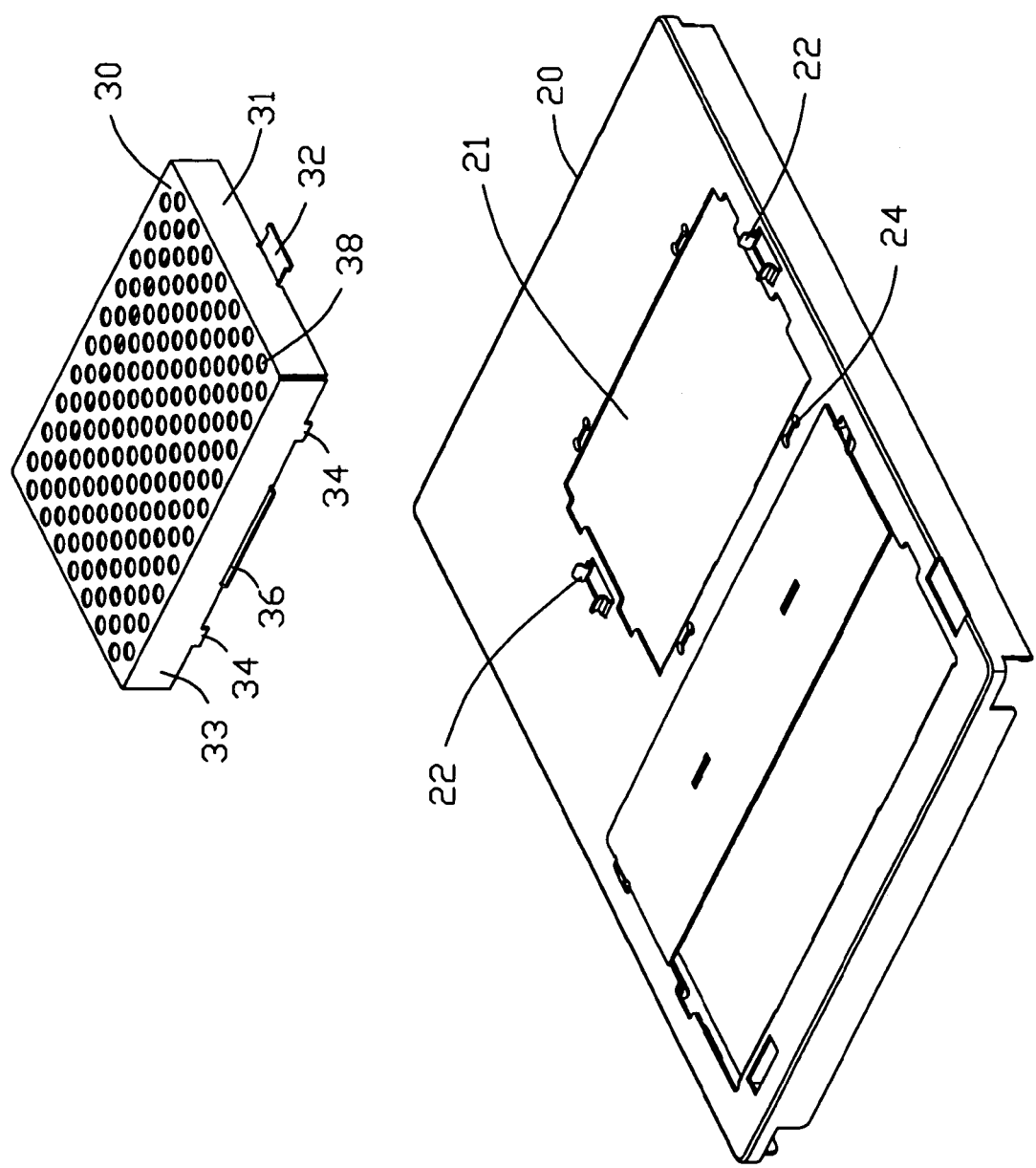
FIG. 1 is an exploded, isometric view of an assembly for securing plates in accordance with a preferred embodiment of the present invention, the assembly for securing plates including a first plate and a second plate.

Referring to FIG. 1, an assembly for securing plates in accordance with a preferred embodiment of the present invention includes a first plate 20 (or a first piece), and a second plate 30 (or a second piece).

The first plate 20 is a front plate of a computer enclosure, made of metallic material. The first plate 20 defines a rectangular opening 21, for extension of a data storage device, such as a hard disk drive, a floppy disk drive, and so on. Each end of opposite ends of the opening 21 of the first plate 20 is stamped to form a pair of opposite generally V-shaped protruding portions 22 performing as a first part of a fixing mechanism for the assembly. Each of the generally V-shaped protruding portions 22 has a first guiding surface (not labeled) and a second guiding surface (not labeled) intersecting with the first guiding surface. The protruding portions 22 are also arcuate. A distance between a junction of the first and second guiding surface of the two protruding portions 22 is less than that between other portions of the opposite protruding portions 22. In addition, the generally V-shaped protruding portions 22 are secured to the first plate by means of welding or other methods. A pair of I-shaped slot 24 is defined on each side of the opening 21.

The second plate 30 is also made of metallic material. An edge of the second plate 30 is bent vertically down to form a shield with resisting EMI (Electro Magnetic Interference) characteristics. Each end of the opposite ends of the second plate 30 is bent vertically down to form a first flange 31. Likewise, each side of the opposite sides of the second plate 30 is bent vertically down to form a second flange 33. A T-shaped tongue piece 32, performing as a second part of the fixing mechanism for the assembly, extends horizontally outward from each of the middle portions of the first flanges 31. In addition, the tongue piece 32 may be I-shaped. A pair of protruding tabs 34 extends coplanarly from each of the second flanges 33. An elongated stop tab 36 horizontally extends outward from each of the second flanges 33 between the two protruding tabs 34. A plurality of spaced heat dissipating holes 38 is defined in the second plate 30.

Figure 2:
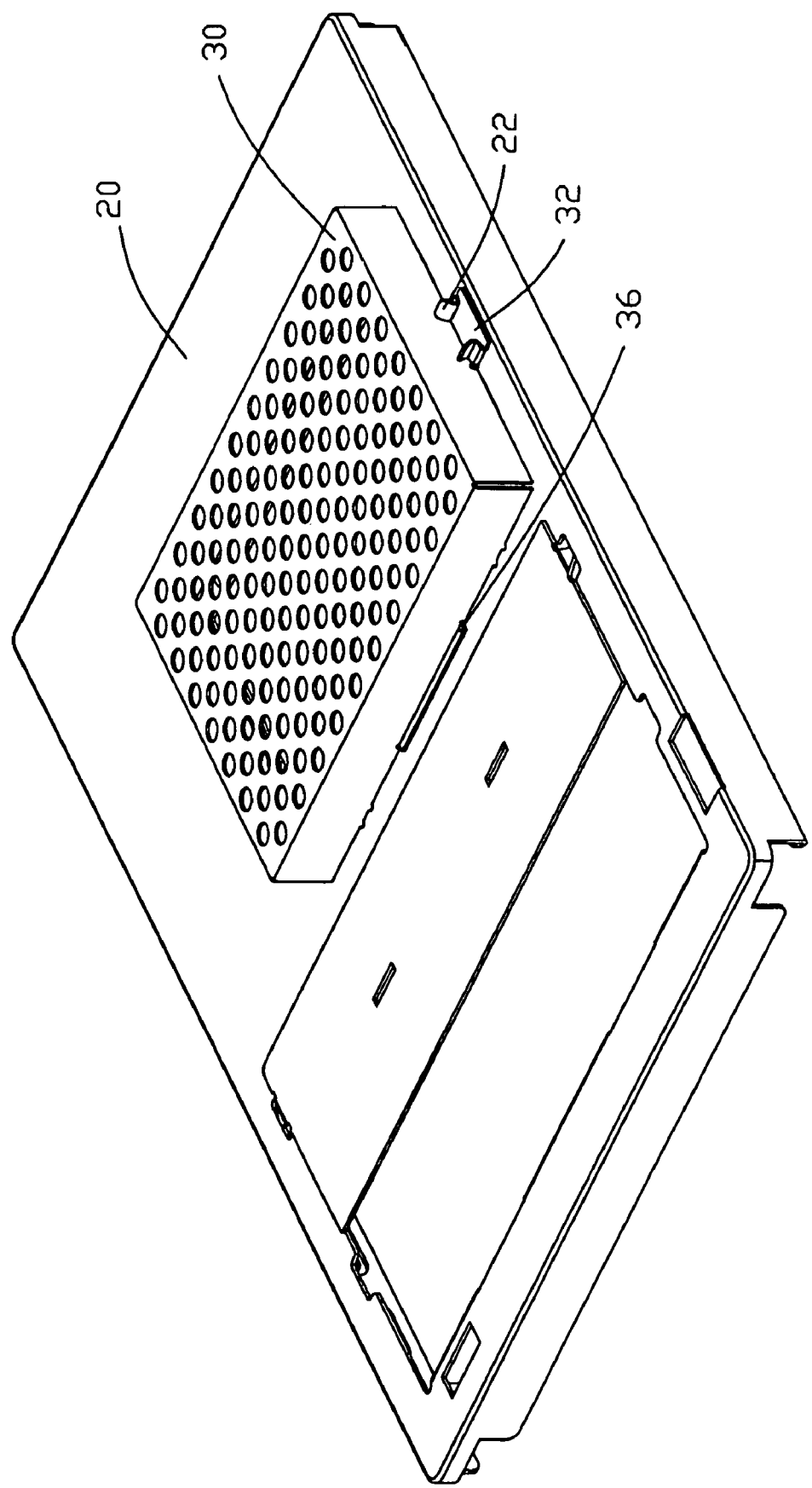
FIG. 2 is an assembled view of the assembly for securing plates of FIG. 1.
Figure 3:
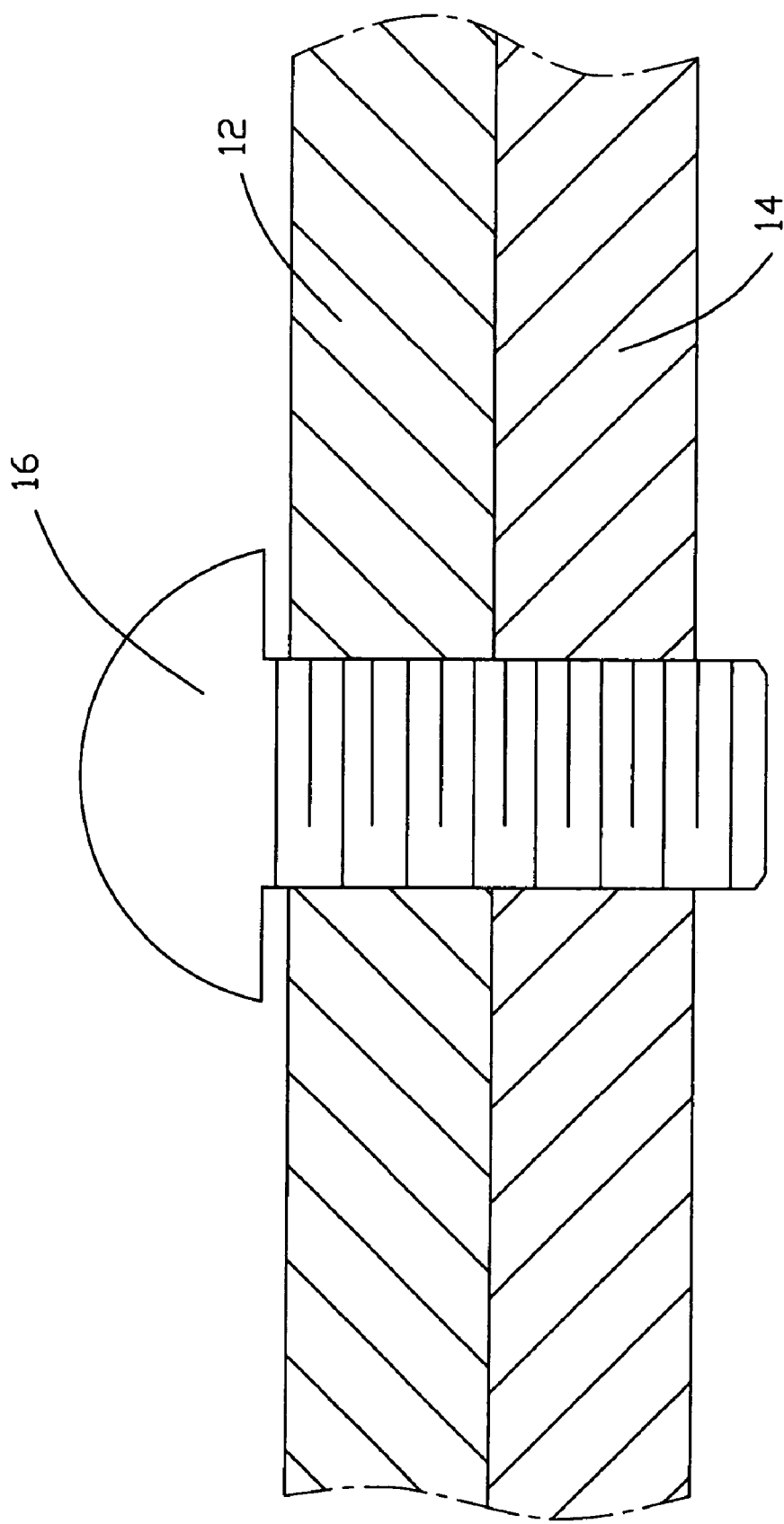
FIG. 3 is a cross section view of a conventional assembly for securing plates.

Referring to FIG. 2, in attachment of the second plate 30 to the first plate 20, the protruding tabs 34 and tongue pieces 32 of the second plate 30 are first aligned with the corresponding slots 24 and protruding portions 22 of the first plate 20. When pressure is applied to the second plate 30, the tongue pieces 32 of the second plate 30 are pressed to slide along the first guiding surfaces of the protruding portions 22 downwardly, and are thereby received into a space between the pair of protruding portions 22. Thereby urging the two protruding portions 22 of the first plate 20 to expand outwards, thereby allowing each of the tongue pieces 32 to slide into the space between the protruding portions 22. Then, each of the tongue pieces 32 of the second plate 30 is tightly clamped between the second guiding surfaces of the corresponding protruding portions 22 due to rebounding of the corresponding protruding portions 22. Simultaneously, the protruding tabs 34 of the second plate 30 engagingly insert in the corresponding slots 24 of the first plate 20 respectively. The two stop tabs 36 of the second plate 30 are resisted by the first plate 20 to prevent the second plate 30 from moving downwards. Thus, the second plate 30 is securely mounted to the first plate 20.

In detachment of the second plate 30 from the first plate 20, the second plate 30 is forcibly lifted up. The tongue pieces 32 of the second plate 30 slide along the second guiding surfaces of the corresponding protruding portions 22 urging the corresponding protruding portions 22 to expand outwards. Thus, the tongue pieces 32 of the second plate 30 easily disengage from the corresponding protruding portions 22 of the first plate 20. Simultaneously, the protruding tabs 34 of the second plate 30 disengage from the corresponding slots 24 of the first plate 20. Therefore, the second plate 30 is conveniently removed from the first plate 20.

While the present invention has been illustrated by the description of preferred embodiments thereof, and while the preferred embodiments have been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

We claim:

1. An assembly comprising:
    a first plate having two pairs of resiliently deformable protruding portions, each of the protruding portions having a first guiding surface and a second guiding surface intersecting with the first guiding surface, a distance between junctions of the first and second guiding surfaces of each pair of protruding portions being less than that between other portions thereof; and
    a shield having a pair of tongue pieces respectively corresponding to the two pairs of protruding portions of the first plate, each of the tongue pieces sliding on and pressing the first guiding surfaces of the corresponding pair of protruding portions to resiliently deform and expand the corresponding pair of protruding portions outwardly, and being clamped between the corresponding pair of protruding portions after each of the tongue pieces slides across the junctions of the corresponding pair of protruding portions to position between the second guiding surfaces thereof.

2. The assembly as recited in claim 1, wherein each of the protruding portions is V-shaped, and the second guiding surface of each protruding portion is positioned between the first guiding surface thereof and the first plate.

3. The assembly as recited in claim 1, wherein the tongue pieces are T-shaped.

4. The assembly as recited in claim 1, wherein the first plate defines a plurality of slots, and the shield forms a plurality of protruding tabs for engagingly inserting in the corresponding slots.

5. The assembly as recited in claim 1, wherein the first plate defines an opening, an edge of a second plate is bent to form the shield for covering the opening.

6. The assembly as recited in claim 5, wherein the two pairs of protruding portions are formed at two opposite sides of the opening respectively.

7. The assembly as recited in claim 1, wherein the pair of tongue pieces extends horizontally from the corresponding end of the two opposite ends of the shield.

8. The assembly as recited in claim 1, wherein the shield defines a plurality of heat dissipating holes.

9. An assembly, comprising:
    a first piece defining an opening in a surface thereof, two pairs of protruding portions extending from the surface adjacent to opposite edges of the opening; and
    a second piece attachable to the first piece to cover the opening, two first flanges bent perpendicularly from opposite edges of the second piece, a tongue piece perpendicularly bent from each of the first flanges and parallel to the surface of the second piece, the tongue pieces being clamped between the corresponding pairs of protruding portions, thereby preventing the second piece removing from the first piece, wherein each of the protruding portions has a first guiding surface and a second guiding surface intersecting with the first guiding surface for the tongue piece sliding thereon.

10. The assembly as recited in claim 9, wherein each of the protruding portions is arcuate.

11. The assembly as recited in claim 9, wherein the tongue pieces are T-shaped.

12. The assembly as recited in claim 9, wherein the first piece defines a plurality of slots, and the second piece forms a plurality of protruding tabs for engagingly inserting in the corresponding slots.

13. An electronic device comprising:
    an enclosure of said electronic device comprising a plurality of first mechanically connectable pieces;
    a mechanically connectable second piece separately attachable to at least one of said plurality of first pieces so as to complete extension of said enclosure; and
    a mechanism for securing said second piece to said at least one of said plurality of first pieces, said mechanism comprising a first part formed on one of said second piece and said at least one of said plurality of first pieces, and a second part formed on the other of said second piece and said at least one of said plurality of first pieces, said second part being slidable on said first part between a first position in which said second part presses said first part to resiliently deform and a second position in which said first part rebounds to an original state so as to engage with said second part and thereby restraining movement of said second piece relative to said at least one of said plurality of first pieces exclusively along a normal direction and a parallel direction to said at least one of said plurality of first pieces.

14. The electronic device as recited in claim 13, wherein said first part comprises a pair of resiliently deformable protruding portions extending normally from said at least one of said plurality of first pieces, and said second part is a tongue piece extending out of said second piece.

15. The electronic device as recited in claim 14, wherein each of said protruding portions is generally V-shaped and comprises a first guiding surface and a second guiding surface intersecting with said first guiding surface, and a distance between junctions of said first and second guiding surfaces is less than that between other portions thereof.

16. The electronic device as recited in claim 15, wherein said tongue piece is positioned between said first guiding surfaces of said guiding portions and blocked by said junctions thereof when said tongue piece is in said first position, and positioned between said second guiding surfaces thereof after said tongue piece is exerted to press said guiding surfaces to expand said guiding portions outwardly so as to slide across said junctions.

* * * * *